United States Patent
Weale et al.

(10) Patent No.: US 11,480,468 B2
(45) Date of Patent: Oct. 25, 2022

(54) TUNABLE TERAHERTZ DETECTOR

(71) Applicant: SEMICONDUCTOR COMPONENTS INDUSTRIES, LLC, Phoenix, AZ (US)

(72) Inventors: Gareth Pryce Weale, New Hamburg (CA); Jan Chochol, Usti nad Labem (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 224 days.

(21) Appl. No.: 16/948,285

(22) Filed: Sep. 11, 2020

(65) Prior Publication Data

US 2022/0082436 A1 Mar. 17, 2022

(51) Int. Cl.
*G01J 3/28* (2006.01)
*H01L 31/0304* (2006.01)
*H01L 31/112* (2006.01)
*H01L 27/144* (2006.01)

(52) U.S. Cl.
CPC ........ *G01J 3/2803* (2013.01); *H01L 27/1446* (2013.01); *H01L 31/0304* (2013.01); *H01L 31/03044* (2013.01); *H01L 31/1129* (2013.01); *G01J 2003/2813* (2013.01)

(58) Field of Classification Search
CPC .......... G01J 3/2803; G01J 3/2823; G01J 5/20; G01J 2003/2813; H01L 27/1446; H01L 31/0304; H01L 31/03044; H01L 31/1129
See application file for complete search history.

(56) References Cited

U.S. PATENT DOCUMENTS

| | | | |
|---|---|---|---|
| 7,420,225 B1 * | 9/2008 | Wanke | B82Y 10/00 257/187 |
| 7,705,415 B1 * | 4/2010 | Nabet | H01L 31/1035 257/443 |
| 9,105,791 B1 * | 8/2015 | Dyer | H01L 31/1127 |
| 2009/0243589 A1 | 10/2009 | Blumberg | |

(Continued)

FOREIGN PATENT DOCUMENTS

WO    WO-2011022544 A2 *    2/2011    ......... G01N 21/3581

OTHER PUBLICATIONS

Hugo Aya Baquero, "Plasmonic waves in two-dimensional electron gas", 2018, J. Phys.; Conf. Ser. 1141 012006.

(Continued)

*Primary Examiner* — Mark R Gaworecki
(74) *Attorney, Agent, or Firm* — Brake Hughes Bellermann LLP

(57) ABSTRACT

A terahertz detector circuit can include a high electron mobility transistor (HEMT) having multiple gates that can be controlled by gate signals to generate a gate-induced modulation pattern in a two-dimensional electron gas (2DEG) of the HEMT. When the gate induced modulation pattern substantially matches a signal induced modulation pattern generated by an incident terahertz signal then a detection efficiency of the incident terahertz signal is improved. Accordingly, an electronically tunable THz detector with high efficiency can be realized. When these THz detectors are arranged in an array and electrically coupled, THz images and/or multi-spectral THz images may be generated.

20 Claims, 14 Drawing Sheets

(56) References Cited

U.S. PATENT DOCUMENTS

| | | | |
|---|---|---|---|
| 2010/0200755 A1* | 8/2010 | Kawano | H01L 31/028 250/338.4 |
| 2015/0109606 A1 | 4/2015 | Peale et al. | |
| 2016/0233962 A1 | 8/2016 | Zhang et al. | |
| 2019/0025613 A1* | 1/2019 | Ding | G02F 1/017 |

OTHER PUBLICATIONS

Abdul Manaf Hashim et al., "Plasma wave interactions in microwave to THz range between carriers in a semiconductor 2DEG and interdigital slow waves", Superlattices and Microstructures 34 (2003) 531-537, Nov. 4, 2019.

Takayuki Watanabe et al., "Ultrahigh sensitive plasmonic terahertz detector based on an asymmetric dual-grating gate HEMT structure", Solid-State Electronics 78 (2012) 109-114.

Hosang Yoon et al., "Plasmonics with Two-Dimensional Conductors", School of Engineering and Applied Sciences, Harvard University, Cambridge, MA; Department of Physics,Columbia University, New York 2014.

* cited by examiner

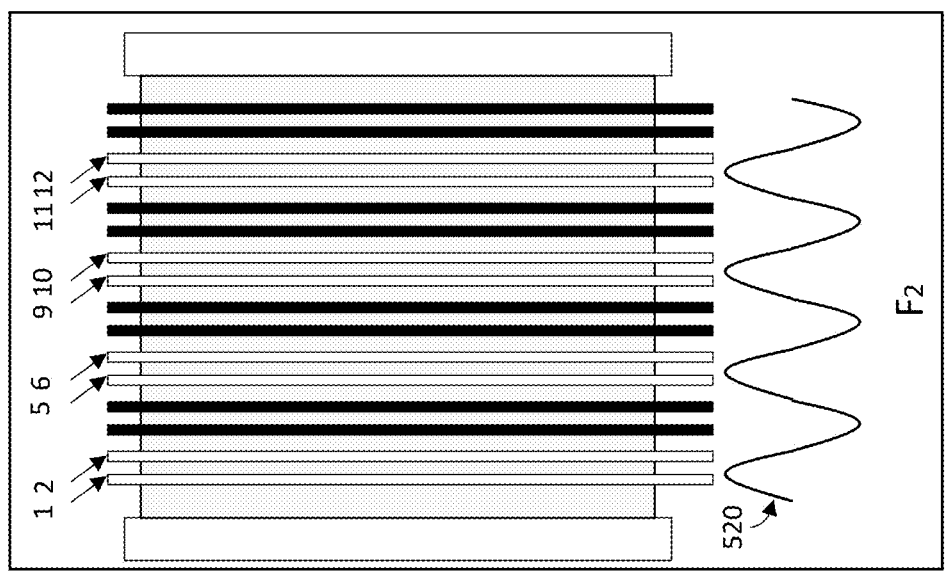

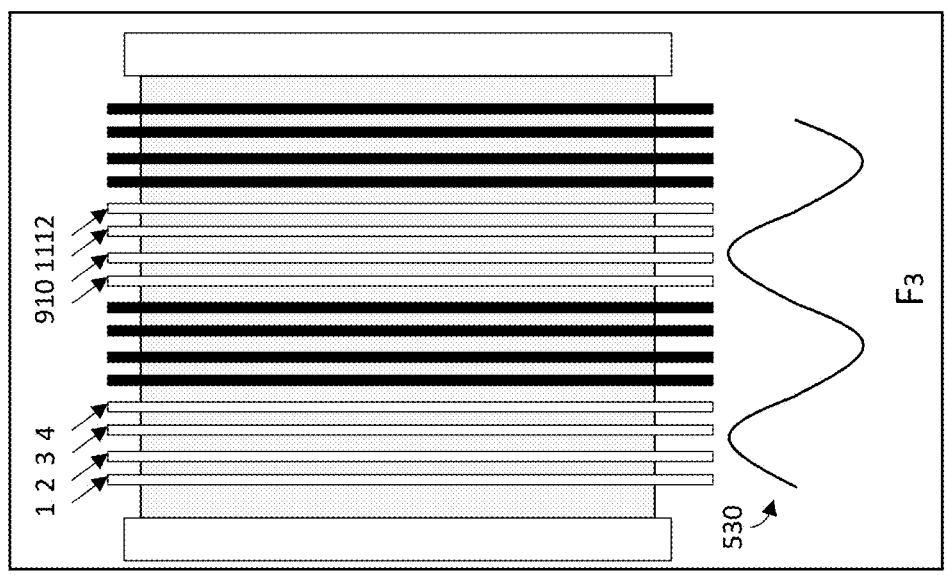

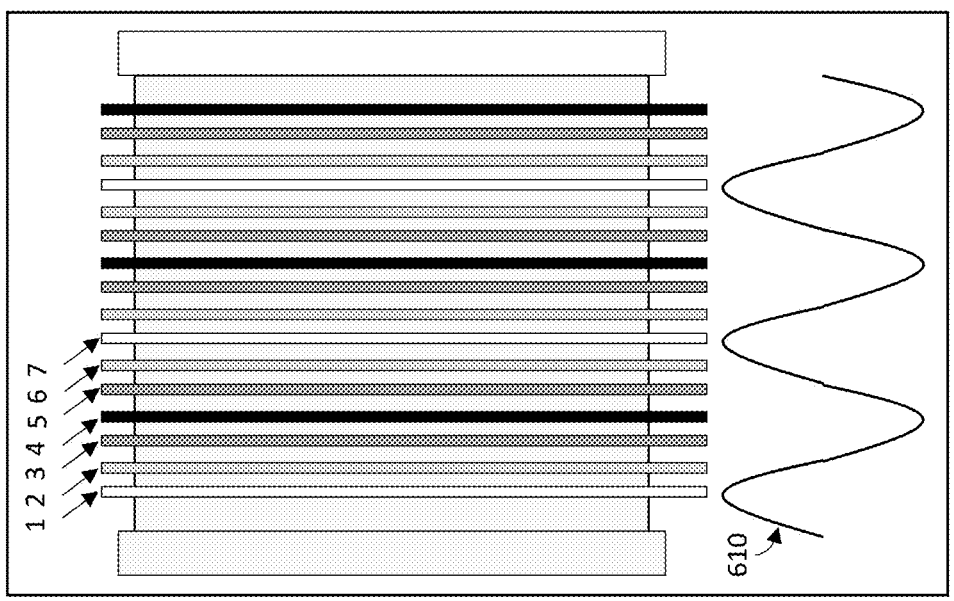

TUNABLE TERAHERTZ DETECTOR

FIELD OF THE DISCLOSURE

The present disclosure relates to a receiver for electromagnetic radiation in a terahertz (THz) portion of the spectrum and more specifically to a tunable THz detector.

BACKGROUND

Terahertz radiation is generally considered as occupying the portion (i.e., band) of the spectrum from 0.3 to 30 THz, having wavelengths in the range of 1 millimeter (mm) to 0.01 mm. Because this band lies between microwave and infrared it may share properties of each. Transmission range in this band is limited by atmospheric absorption and technology development for transmission and reception has been slow. Interest has grown in time, however, because of advantages associated with this band. For example, THz radiation may be able to penetrate a wide variety of materials while lacking the energy to cause damage (e.g., harm to humans). Communication in this band may also support extremely high bandwidths. The applications for this band will be based on devices, such as a THz detector.

SUMMARY

In at least one aspect, the present disclosure generally describes a terahertz detector circuit that includes a high electron mobility transistor (HEMT) and a gate driver. The HEMT includes a two-dimensional electron gas (2DEG) at a heterojunction between a first heterojunction layer and a second heterojunction layer. The HEMT also includes a plurality of gate terminals. The plurality of gate terminals are disposed on a trace layer that is proximate to (e.g., in an adjacent layer to) the 2DEG. For example, the plurality of gate terminals can be disposed on a trace layer with the first heterojunction layer between the trace layer and the 2DEG. Additionally, the plurality of gate terminals can be spaced apart and span at least a portion of (e.g., an entire length or width of) the 2DEG. The gate driver is configured to apply signals to the plurality of gate terminals according to a tuning configuration in order to generate a gate-induced modulation pattern in the 2DEG that increases a detection sensitivity for a particular terahertz signal.

In another aspect, the present disclosure generally describes a terahertz detector array that includes a plurality of HEMTs, a gate driver circuit and a sensing readout circuit. Each HEMT in the plurality of HEMTs includes a 2DEG at a heterojunction between a first heterojunction layer and a second heterojunction layer. Additionally, each HEMT includes a plurality of gate terminals disposed on a trace layer proximate to the 2DEG. For example, the plurality of gate terminals can be disposed on the trace layer with the first heterojunction layer between the trace layer and the 2DEG. Additionally, the plurality of gate terminals can be spaced apart and span at least a portion of the 2DEG. The gate driver circuit is configured to apply signals to the plurality of gate terminals of each HEMT according to a tuning configuration in order to generate a gate-induced modulation pattern in the 2DEG. The gate-induced modulation pattern increases a detection sensitivity for a particular terahertz signal. The sensing and readout circuit is configured to receive detection signals from each HEMT in response to the particular terahertz signal and to generate an output (e.g., THz image, Multi-spectral THz image) based on the detection signals.

In another aspect, the present disclosure generally describes a method for detecting THz radiation. The method includes applying a first set of gate signals to a plurality of gate terminals that are spatially coupled to a two-dimensional electron gas (2DEG) to generate a first gate-induced modulation pattern in the 2DEG based on the first set of gate signals. The method further includes receiving THz radiation at the 2DEG, the THz radiation including frequency components that generate signal-induced modulation patterns in the 2DEG. The method further includes detecting a first frequency component of the THz radiation that generates a first signal-induced modulation pattern that substantially matches the first gate-induced modulation pattern.

In a possible implementation of the method, the detection of the THz radiation can be tuned by applying a second set of gate signals to the plurality of gate terminals (i.e., instead of the first set of gate signals) to generate a second gate-induced modulation pattern in the 2DEG based on the second set of gate signals, and detecting a second frequency component of the THz radiation that generates a second signal-induced modulation pattern that substantially matches the second gate-induced modulation pattern.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

FIGS. 5A-5C are top views of the multi-gate HEMT shown in FIG. 3, each illustrating a different tuning configuration according to various implementations of the present disclosure.

FIG. 6 is a top view of the multi-gate HEMT shown in FIG. 3 illustrating a complex tuning configuration according to a possible implementation of the present disclosure.

The components in the drawings are not necessarily to scale relative to each other. Like reference numerals designate corresponding parts throughout the several views.

DETAILED DESCRIPTION

The present disclosure describes a detector for THz radiation. The detector is based on a high electron mobility transistor (i.e., HEMT), which can be fabricated using planar fabrication methods for a variety of materials, including (but not limited to) gallium nitride (GaN), gallium arsenide (GaAs) and silicon carbide (SiC). The methods of planar fabrication can facilitate a high-volume production of discreet detectors and/or fabrication of one-dimensional (1D) or two-dimensional (2D) detector arrays. The disclosed THz detector can be electronically tuned to a plurality of frequencies (i.e., channels). The electronic tuning can eliminate the need for an external filter (or filters) used in conjunction with the detector. Additionally, the electronic tuning can increase the detection sensitivity of the detector at the tuned frequency (e.g., for a particular terahertz signal). The fabrication, sensitivity, and electronic tunability may allow the detector to be used in a variety of applications, including (but not limited to) communications and imaging.

Figure 1:
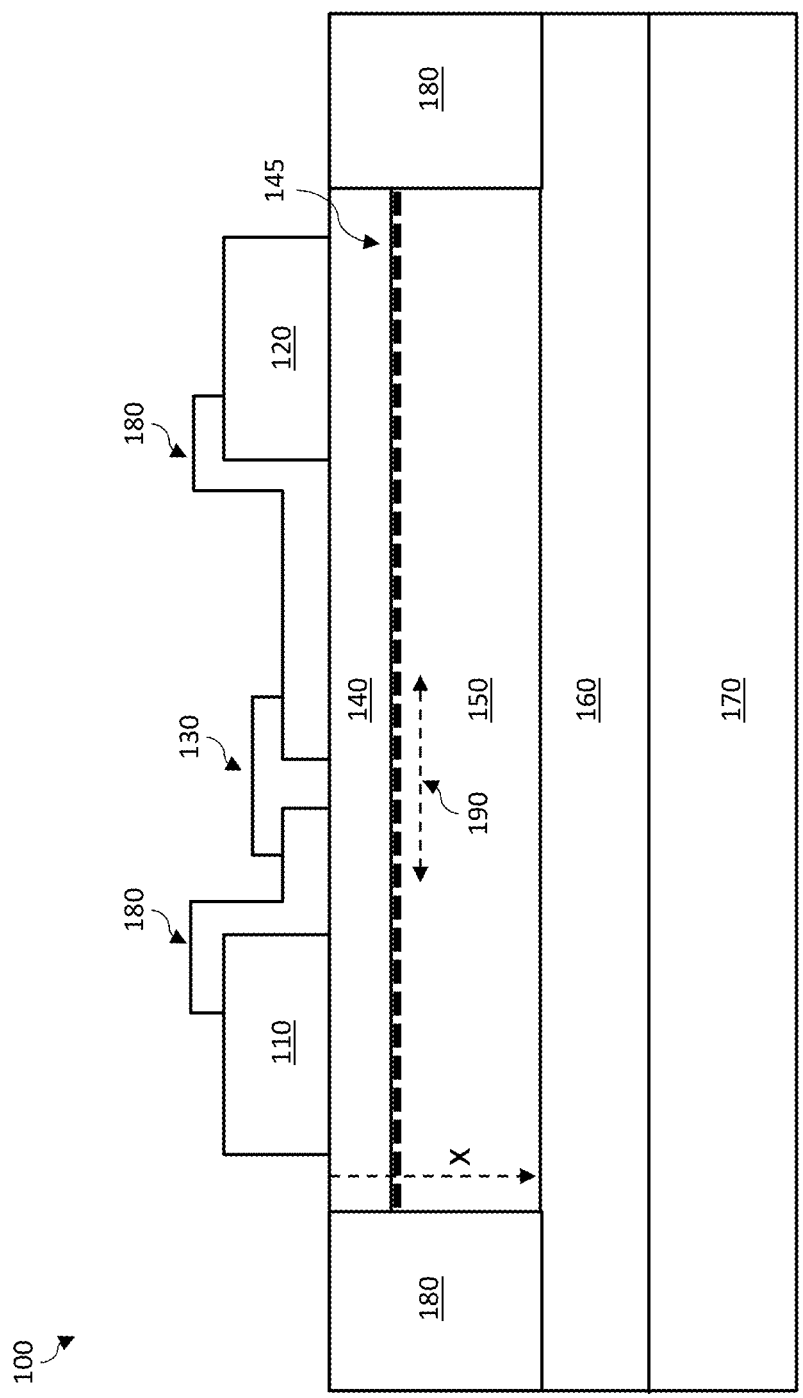
FIG. 1 illustrates a side cross-sectional view of a high electron mobility transistor (HEMT) according to an implementation of the present invention.

FIG. 1 illustrates a cross-section of a HEMT according to an implementation of the present disclosure. The HEMT 100 can operate electrically as a field-effect transistor that includes a source terminal (i.e., source 110), a drain terminal (i.e., drain 120), and a gate terminal (i.e., gate 130). Conduction in the HEMT occurs at a heterojunction 145 between layers of semiconductors having different bandgaps. Accordingly, the HEMT 100 may include a first heterojunction layer 140 (e.g., aluminum gallium nitride (AlGaN)) in contact with (e.g., contiguous with) a second heterojunction layer 150 (e.g., gallium nitride (GaN)). The layers may be grown (e.g., using epitaxial growth) on a substrate layer (i.e., substrate 170) that can be a material different from the heterojunction layers 140, 150. Accordingly, the HEMT 100 may include a transition layer 160 (or layers) to transition the crystal lattice of the substrate 170 (e.g., silicon (Si)) to that of the second heterojunction layer 150. In some implementations, the HEMT 100 may also include dielectric portions 180 for isolation, insulation, and/or passivation.

Figure 2:
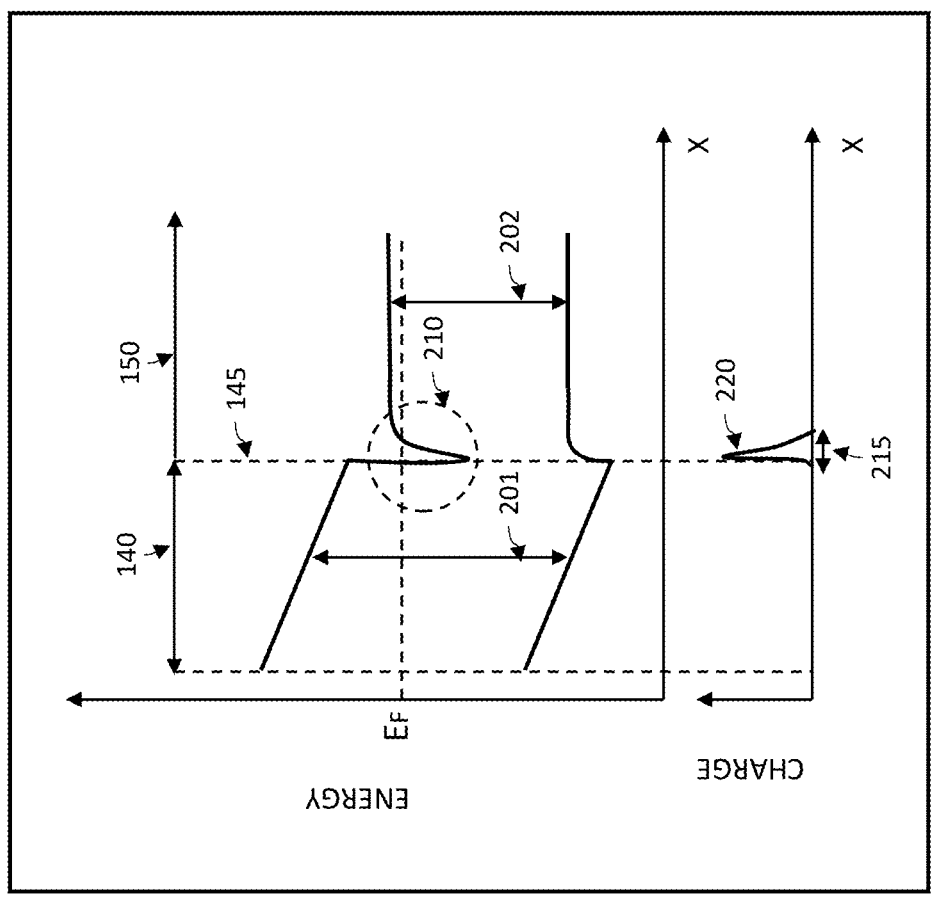
FIG. 2 illustrates an energy band diagram of the heterojunction between the first heterojunction layer and the second heterojunction layer of a HEMT, such as shown in FIG. 1.

FIG. 2 illustrates an energy band diagram of the heterojunction 145 along a direction (i.e., X) including the first heterojunction layer 140 and the second heterojunction layer 150. A first bandgap 201 of the first heterojunction layer 140 (e.g., $Al_xGa_{1-x}N$) is larger than a second bandgap 202 of the second heterojunction layer 150 (e.g., GaN). When the first heterojunction layer 140 and the second heterojunction layer 150 are brought in contact, a quantum well 210 is formed at the heterojunction 145. The quantum well 210 defines a high-conductivity area 215 containing an amount of charge 220. In other words, a two-dimensional electron gas (2DEG), corresponding to the quantum well, exists between the first heterojunction layer 140 and the second heterojunction layer 150 (i.e., at the heterojunction 145). The first heterojunction layer and the second heterojunction layer are materials having different bandgaps. For example, the materials may be based on GaN, GaAs, or InP.

The HEMT can be configured as a detector of THz radiation because a conductivity between the source 110 and the drain 120 can be adjusted by a voltage applied to the gate 130 and by THz radiation incident on the 2DEG. Further, when the HEMT includes a plurality of gate terminals between the source 110 and the drain 120, the HEMT can be configured as a narrow-band (e.g., single frequency) resonant detector of THz radiation.

Figure 3:
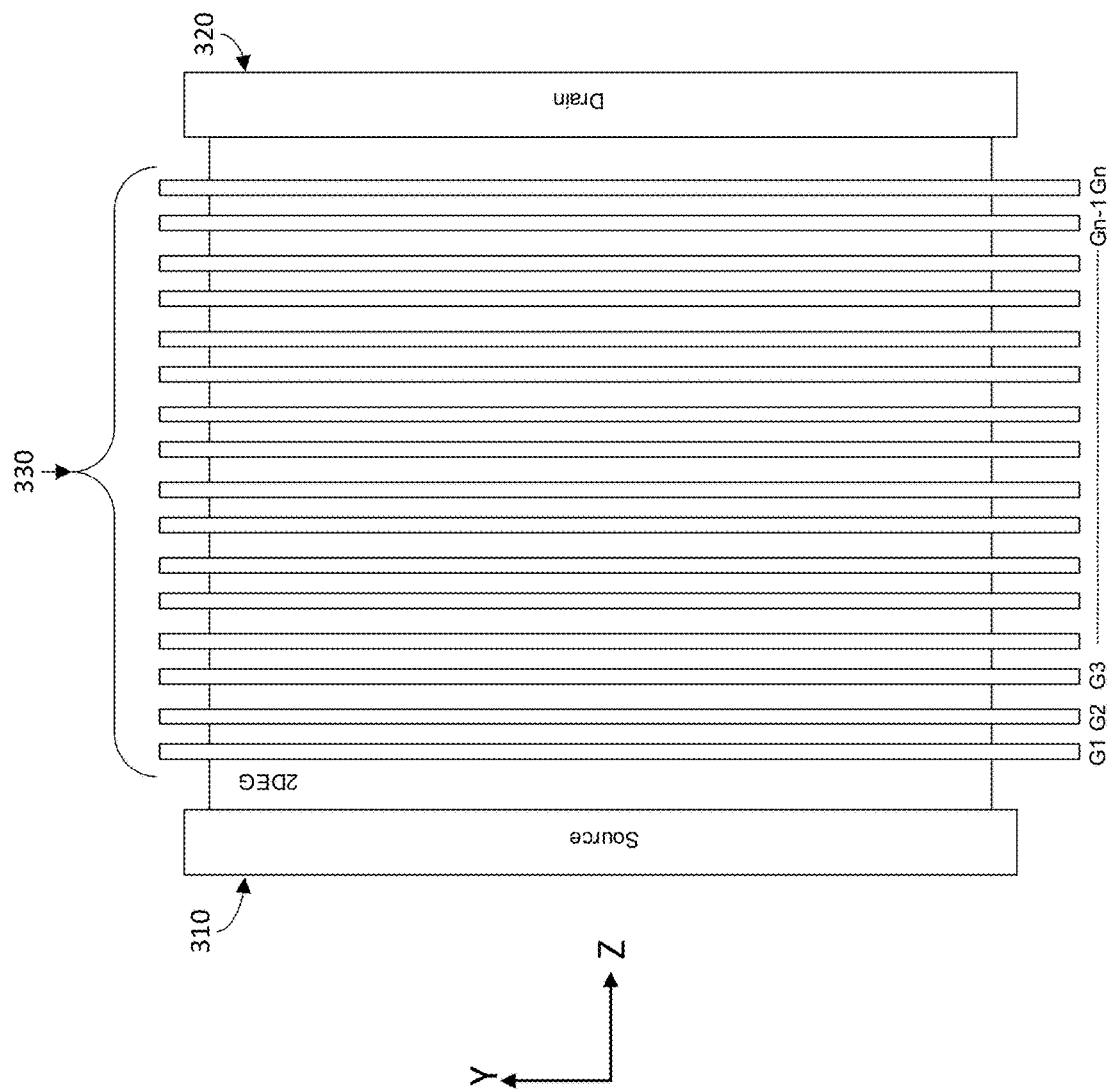
FIG. 3 is a top view of a HEMT including a plurality of gate terminals (i.e., multi-gate HEMT) according to a possible implementation of the present disclosure.

FIG. 3 is a top view of a HEMT including a plurality of gate terminals 330 (i.e., G1, G2 . . . Gn) between a source terminal 310 and a drain terminal 320. The gate terminals 330 are parallel and positioned at intervals (e.g., equal intervals) between the source terminal 310 and the drain terminal 320 over a heterojunction 145 (not shown). In other words, the gate terminals 330 (i.e., the plurality of gate terminals) can be over the 2DEG and spaced apart along a direction between the source terminal 310 and the drain terminal 320 (i.e., in the Z-direction as shown in FIG. 3). Additionally, the gate terminals 330 can span (i.e., extend across) at least a portion of the 2DEG along a direction that is orthogonal to the direction between the source terminal 310 and the drain terminal 320 (i.e., in the Y-direction as shown in FIG. 3). For example, the gate terminals 330 shown in FIG. 3 are over the 2DEG, are parallel, are spaced apart at regular intervals between the source terminal 310 and the drain terminal 320, and each span the entire 2DEG in the Y-direction.

The heterojunction between the source terminal 310 and the drain terminal 320 acts as a conduction channel (i.e., channel) due to the 2DEG. The 2DEG can be affected in local areas below each gate terminal by a voltage applied to each gate terminal. In other words, signals applied to the gate terminals can spatially modulate the electron density (i.e., conductivity) of the 2DEG (i.e., gate-induced modulation). For example, a pattern of signals applied to the gate terminals 330 can correspond to a pattern of electron density in the 2DEG (i.e., a gate-induced modulation pattern). The 2DEG may also be modulated by THz radiation (i.e., wave-induced modulation).

The 2DEG in the HEMT can interact with (e.g., couple) THz radiation. For example, THz radiation can launch (i.e., excite) a plasma wave of modulated charge density in the 2DEG. Because the 2DEG is constrained to a layer with a limited extent, standing waves (i.e., plasma waves) in the 2DEG can be created by incident THz radiation. In other words, spatially modulated patterns of carrier density and/or carrier drift-velocities can be formed in the 2DEG by incident THz radiation. This spatial modulation can generate or alter a current in the HEMT according to an amplitude of the THz radiation. Thus, THz radiation incident on the HEMT can be detected as a change in a current (e.g., a drain source current ($I_DS$)) of the HEMT. Accordingly, a THz detector using the HEMT may include additional circuitry coupled to the HEMT to support the tuning, sensing, and readout of the detected signal. In some implementations, this additional circuitry is further configured to support multiple THz detectors acting together (e.g., as an imaging array).

Without gate-induced modulation, the HEMT may respond equally to most (e.g., all) frequencies in the THz spectrum (i.e., has a wide response band) but the response may be relatively inefficient creating a corresponding current (i.e., has a low response sensitivity). Accordingly, a narrow band detector constructed using an external filter can lack a response sensitivity sufficient for practical applications. Gate-induced modulation, however, can facilitate a high response sensitivity over a narrow band. Further, because the gate-induced modulation is electronically configurable, the narrow band with high response sensitivity can be tuned.

Spatially modulating the charge density of the 2DEG using signals applied to the gate terminals 330 can create a charge pattern in the 2DEG that resonates with a charge pattern generated by a particular THz frequency. This resonance may increase the sensitivity of the detection of the THz radiation (i.e., resonant detection). Resonant detection (i.e., resonant coupling) can improve the THz detection efficiency at a resonant frequency by several orders of magnitude (i.e., compared to non-resonant detection). For example, non-resonant detection may have an efficiency of tens of volts per watt (i.e., 10's V/W), while resonant detection may have an efficiency of two thousand volts per watt (i.e., 2000 V/W). The increased efficiency may correspond decreases in cost, size, and power.

Figure 4:
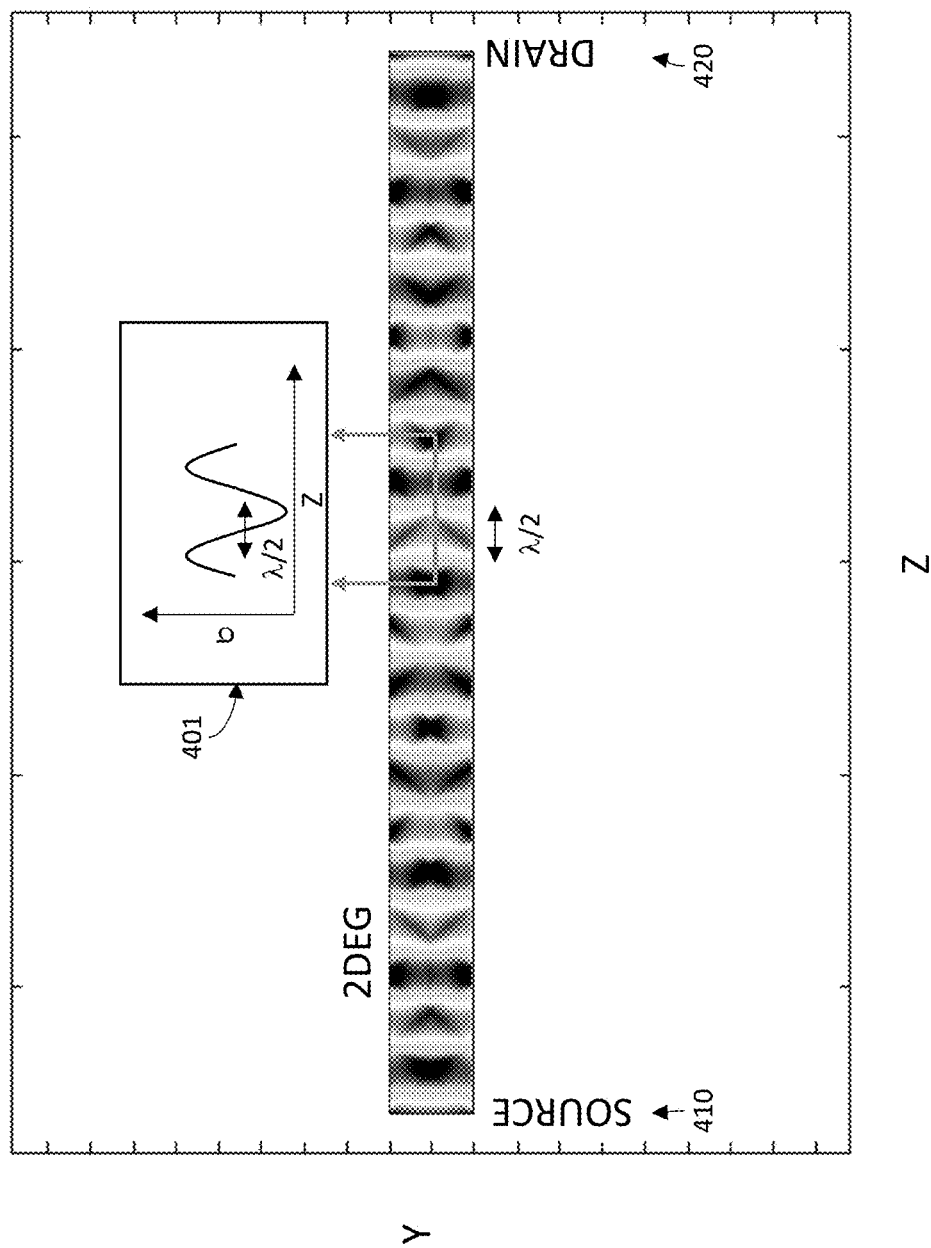
FIG. 4 is a plot of an example wave-induced modulation pattern in a 2DEG.

FIG. 4 is a plot of an example wave-induced modulation pattern of the 2DEG (i.e., a surface plasmon). The plot illustrates a surface charge density ($\sigma$) pattern in the 2DEG. The pattern alternates sinusoidally between areas of high charge density and areas of low charge density along a dimension (z) between a source terminal 410 and a drain terminal 420. The alternating pattern can correspond to (but not necessarily match) the electron density wave (i.e., plasmon) induced in the 2DEG. The plasmon has a spatial frequency (F) and a spatial wavelength ($\lambda$) that correspond to (but not necessarily match) a frequency (in a THz band) of the incident THz radiation. For example, 1 THz may have a spatial wavelength of about 40 micrometers ($\mu$m). As shown in the surface charge density ($\sigma$) versus position (Z) graph 401 of FIG. 4, extreme high and low charge density areas can be separated by a one half of the spatial wavelength (i.e., $\lambda/2$).

Returning to FIG. 1, a negative bias applied to the gate 130 can block (i.e., turn OFF) a flow of electrons from the source 110 to the drain 120, while a positive bias applied the gate terminal can allow (i.e., turn ON) a flow of electrons from the source 110 to the drain 120. These conditions result because a negative bias applied to a gate terminal can reduce an electron density in an area 190 below the gate 130, while a positive bias applied to the gate 130 can increase the electron density in the area 190 below the gate 130. Thus, an electronic signal (e.g., voltage) applied to the gate 130 can locally modulate the electron density of the 2DEG.

When multiple gates are utilized, such as shown in FIG. 3, a signal applied to each gate can locally modulate the electron density of the 2DEG in the area of each gate. Accordingly, multiple electronic signals can create the gate-induced modulation pattern that corresponds to the wave-induced modulation pattern created by the incident THz radiation, such as shown in FIG. 4. When the gate-induced modulation pattern corresponds (e.g., is aligned) with the wave-induced modulation pattern, resonant coupling exists between the HEMT detector and the incident THz frequency.

Resonant coupling can convert energy from the incident THz radiation into a detected signal more efficiently than other coupling (e.g., non-resonant coupling). In other words, the THz signal is resonantly detected when the gate-induced modulation pattern correlates highly with (e.g., has a spatial frequency and/or spatial phase that substantially matches) the wave-induced modulation pattern. Conversely, when the gate-induced modulation pattern correlates poorly with the wave-induced modulation pattern, the resulting plasma wave is not resonantly coupled by the detector. By adjusting the gate-induced modulation pattern, the detector may be tuned to an incident THz frequency for resonant detection.

Figure 5A:
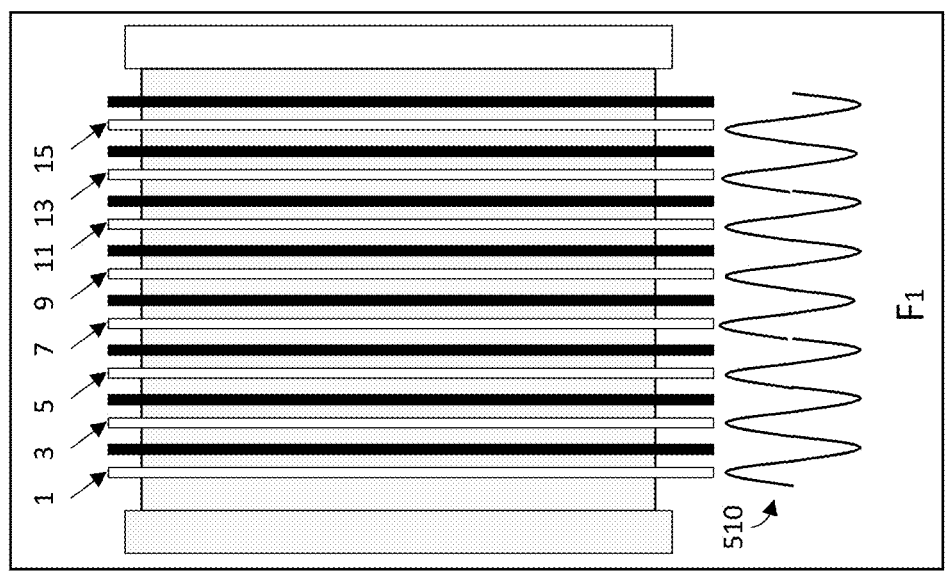

FIGS. 5A-5C are top views of the HEMT shown in FIG. 3, each having a different tuning configuration according to various implementations of the present disclosure. Each gate terminal in the figures are colored according to their received signal. In this implementation, the received signal can be one of two possible states (i.e., levels): ON or OFF. For example, gate terminals that receive a positive voltage (i.e., ON voltage) that increases a local electron density are colored white to indicated that they are in an ON configuration (i.e., are ON), while gate terminals that receive a negative voltage (i.e., OFF voltage) that decreases a local electron density are colored black to indicated that they are in an OFF configuration (i.e., are OFF). A tuning configuration can be determined by the ON/OFF pattern of the plurality of gates.

FIG. 5A illustrates a first possible tuning configuration of the HEMT. The HEMT includes 16 gates (i.e., 1, 2, 3, . . . 16) and in the first tuning configuration, the gates are alternatively ON and OFF. In other words, the odd gates (1, 3, 5, . . . 15) are ON, while the even gates (i.e., 2, 4, 6, . . . 16) are OFF. The gate-induced modulation pattern formed in the 2DEG by the first possible tuning configuration approximates a first wave-induced modulation pattern 510 at a first spatial frequency ($F_1$).

FIG. 5B illustrates a second possible tuning configuration of the HEMT. In the second tuning configuration, the gates are turned ON and OFF in pairs. In other words, gates 1 and 2 are ON, while gates 3 and 4 are OFF, and so on. The gate-induced modulation pattern formed in the 2DEG by the second possible tuning configuration approximates a second wave-induced modulation pattern 520 at a second spatial frequency ($F_2$).

FIG. 5C illustrates a third possible tuning configuration of the HEMT. In the third tuning configuration, the gates are turned ON and OFF in groups of four. In other words, gates 1, 2, 3, and 4 are ON, while gates 5, 6, 7, and 8 are OFF, and so on. The gate-induced modulation pattern formed in the 2DEG by the third possible tuning configuration approximates a third wave-induced modulation pattern 530 at a third spatial frequency ($F_3$).

The first spatial frequency ($F_1$) is the highest spatial frequency possible for the multi-gate HEMT as shown. Thus, the first tuning configuration (i.e., alternatively ON/OFF configuration) corresponds to a highest tunable frequency of the THz detector. Accordingly, the spacing (i.e., pitch (p)) of the gates can correspond to the highest tunable frequency (e.g., $p=\lambda_{min}$). As shown in FIGS. 5A-5C, the first spatial frequency is higher than the second spatial frequency, which is higher than the third spatial frequency (i.e., $F_1>F_2>F_3$). As the spatial frequency is reduced, more gates are used for each phase. Accordingly, the number of gates (N) and the pitch (p) can correspond to the lowest tunable frequency (e.g., $N \cdot p=\lambda_{max}$).

The ON/OFF tuning configurations described thus far can create square-wave gate-induced modulation patterns to correlate with a sinusoidal wave-induced modulation pattern. The correlation between a gate-induced modulation patterns and a wave-induced modulation pattern can be increased with more complex tuning configurations.

FIG. 6 illustrates a top view of the HEMT shown in FIG. 3 having a complex tuning configuration according to an implementation of the present disclosure. Instead of gate signals having two levels (i.e., an ON level or an OFF level), the gate signal for tuning configuration of FIG. 6, can have four possible levels. In a possible tuning configuration, the first gate (1) is driven by an ON signal that increases a local electron density and the fourth gate (4) is driven by an OFF signal that decrease a local electron density, as describe before (see FIGS. 5A-5C). The second gate (2) and the third gate (3), however, are driven (i.e., biased) by a high intermediate signal and a low intermediate signal, respectively. The high intermediate signal can have a level between the low intermediate signal and the ON signal, while the low intermediate signal can have a level between the high intermediate signal and the OFF signal. In other words, the signals applied to gates 2 and 3 gradually transition from an ON level at gate 1 to an OFF level at gate 4. Further, signals applied to gates 5 and 6 gradually transition from the OFF level at gate 4 to an ON level at gate 7. This pattern repeats to form a gate-induced modulation pattern that approximates a sinusoid wave-induced modulation pattern 610.

The HEMT including a plurality of gates (i.e., the multi-gate HEMT) can be driven by a plurality of signal levels to more accurately approximate the amplitude, frequency and phase of a sinusoid. Accordingly, the disclosed THz detector can be configured to electrically tune to a particular THz frequency. Additionally, the multi-gate HEMT can be driven by plurality of signal levels to approximate more complex wave-induced modulation patterns. For example, a THz signal that is a combination of multiple THz frequency components may produce a complex wave-induced modulation pattern. Using a complex tuning configuration can generate a gate-induced modulation pattern to increase the coupling efficiency (i.e., detection efficiency) of the THz signal. Accordingly, the disclosed THz detector can be configured to electrically tune to a particular THz signal.

Figure 7:
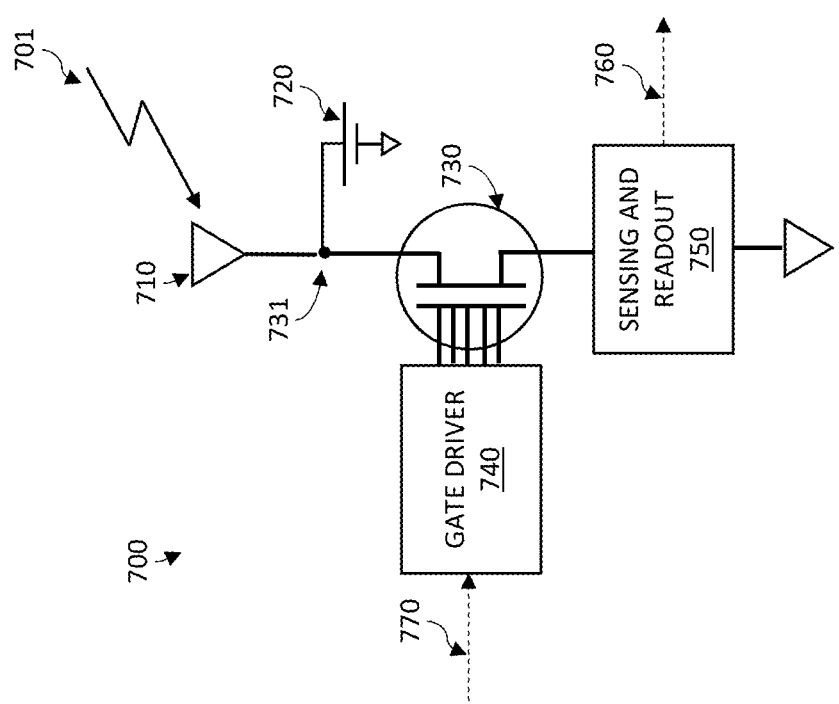
FIG. 7 is a schematic of a terahertz detector circuit according to an implementation of the present disclosure.

FIG. 7 is a schematic THz detector circuit 700 according to an implementation of the present disclosure. The THz detector circuit 700 includes a multi-gate HEMT 730, as described above. The gate terminals of the multi-gate HEMT 730 can be coupled to a gate driver circuit (i.e., gate driver 740). The gate driver 740 is configured (e.g., by a tuning signal 770) to generate gate signals to configure the multi-gate HEMT 730 (i.e., the 2DEG) for resonant coupling of received THz radiation 701.

The THz radiation 701 can be received directly by the HEMT (e.g., THz radiation incident on the heterojunction) or can be received via an antenna that is coupled to the HEMT. The antenna is configured to convert the free-space THz radiation into a (THz) signal current. As shown in FIG. 7, an antenna 710 can be coupled to a receiving terminal 731 (e.g., the drain terminal) of the HEMT 730. The receiving terminal 731 can also be coupled to a DC source (e.g., voltage source 720), which causes a (DC) current to flow through the HEMT 730 (e.g., from a drain terminal to a source terminal). The current flowing through the HEMT is modulated by a plasmon in the 2DEG created by the signal current. In a possible implementation, the modulated current flowing through the HEMT can be sensed and transmitted to an output 760 by a sensing and readout circuit 750.

Figure 8:
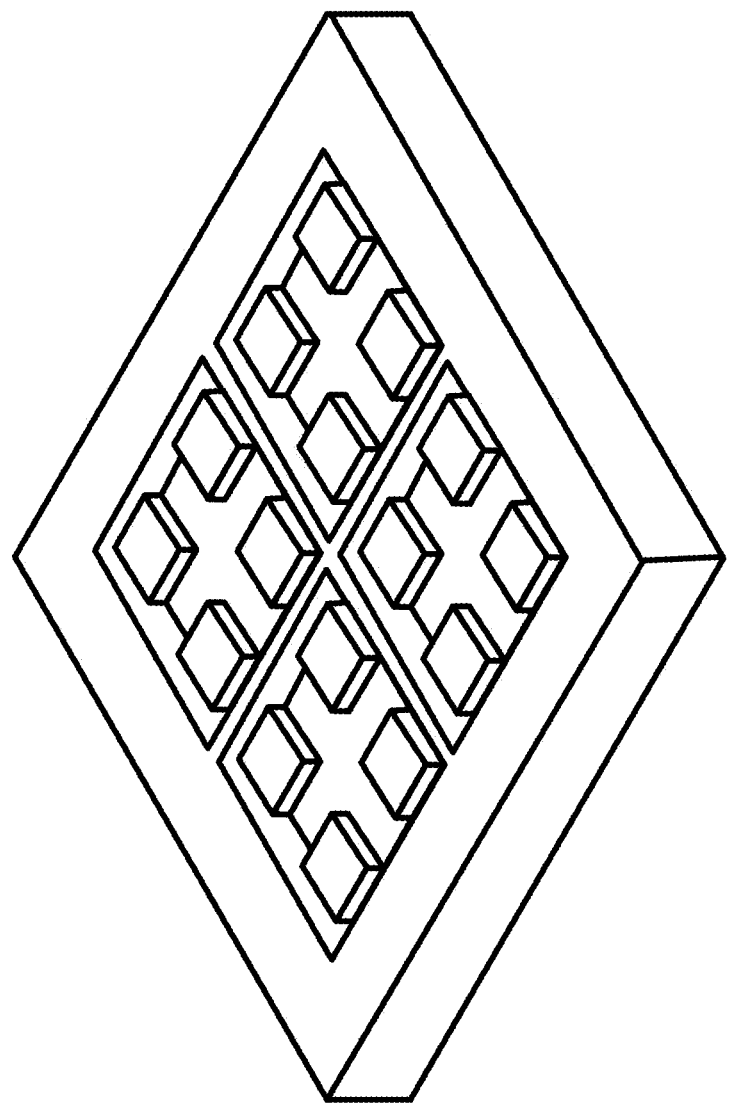
FIG. 8 is a perspective view of a terahertz detector array.

The THz detector circuit shown in FIG. 7 can be used alone or as part of an array of detector circuits. The array of detector circuits may be 1D array (e.g., line scanner, near field optics) or 2D array. FIG. 8 is a perspective view of a 2D THz detector array. The array shown in FIG. 7, includes 16 rectangular-solid (or cuboid) conducting antennas that are arranged in a grid. Each antenna can be coupled to a HEMT (not shown). Accordingly, the array shown can include 16 multi-gate HEMTs. The multi-gate HEMTs may each be coupled to a dedicated gate driver or may be coupled to a gate driver shared with all (or a portion) of the multi-gate HEMTs. The gates of each multi-gate HEMT may be configured to receive the same tuning configuration (i.e., tuned to the same frequency) or the gate of each multi-gate HEMT may receive different tuning configurations (e.g., tuned to different frequencies). Additionally, the outputs of the multi-gate HEMTs may be combined or may be processed individually.

In one possible implementation of the THz detector array, the HEMTs are tuned to the same frequency and the outputs are combined. In this implementation, the THz detector array may be able to capture more radiation (i.e., have an improved sensitivity) because of an increased effective area of the THz detector array.

In another possible implementation of the THz detector array, the output of the HEMTs are processed as pixels in an imager. When all HEMTs are tuned to the same tuned frequency, the outputs (i.e., detection signals) of the HEMTs can be processed (e.g., by the sensing and readout circuit 750) to create an output 760 that is an image of THz radiation (i.e., terahertz image) at the tuned frequency in a field of view.

The response time for tuning the HEMTs may be very small (e.g., nanoseconds). Accordingly, in another possible implementation the THz detector array and output 760 a multi-spectral terahertz image. The multi-spectral THz image can be created by sequentially capturing a first THz image at a first tuned frequency, a second THz image at a second tuned frequency, and so on and then combining the sequentially captured THz images.

In another possible implementation of the THz detector array, HEMTs in the THz detector array may be tuned differently from one another so that different THz frequencies may be captured simultaneously.

Figure 9:
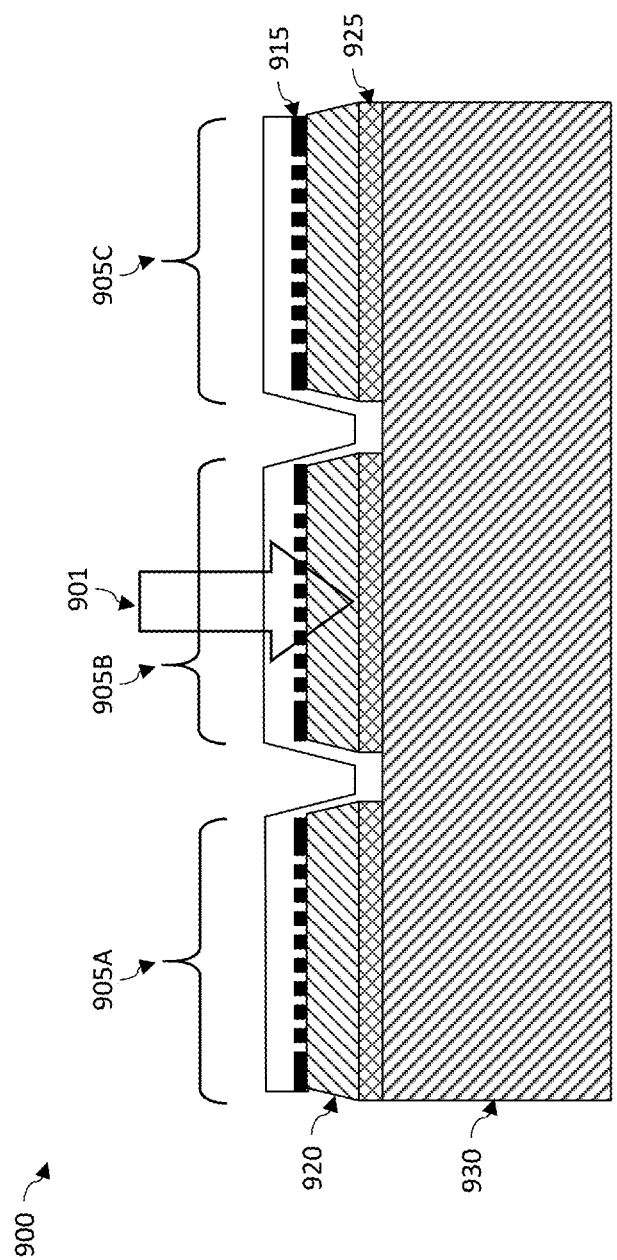
FIG. 9 illustrates a side, cross-sectional view of a possible front-side illumination configuration of a THz detector array.

The HEMTs in a THz detector array may be configured to receive THz radiation at the heterojunction (i.e., at the 2DEG) from different directions. FIG. 9 illustrates a THZ detector array in a front-side illumination configuration. The THz detector array 900 includes a plurality of multi-gate HEMTs 905A, 905B, 905C. Each HEMT includes a trace layer 915 proximate to the 2DGE on which multiple gate terminals are disposed. The gate terminals are spaced apart between a source terminal and a drain terminal and span at least a portion of the 2DEG. Each HEMT includes a first heterojunction layer 920 and a second heterojunction layer 925, and a heterojunction (i.e., 2DEG) therebetween. The heterojunction layers and the trace layer can be fabricated on a substrate 930. Because the substrate 930 material (e.g., silicon, Si) may absorb THz radiation, the HEMT may be arranged to receive THz radiation 901 first at the trace layer (i.e., front side illumination).

In a front-side illumination configuration, the THz radiation passes through the trace layer 915 before reaching the heterojunction (i.e., the 2DEG). In other words, the electrodes (e.g., gates) can partially block the incident radiation from reaching the 2DEG thereby decreasing coupling. In some implementations, however, the gate dimension and spacing of the gates can be selected to form a diffractive optical element (DOE). The DOE can be configured to match an incident wavevector to predetermined values in order to increase coupling at certain condition in front-side illumination.

In some implementations it may be desirable to prevent blockage and diffraction caused by the gate electrodes (e.g., to increase sensitivity). In these implementations, a back-side illumination configuration may be used. In a back-side illumination configuration, the THz radiation passes through the substrate before reaching the heterojunction (i.e., the 2DEG).

Figure 10A:
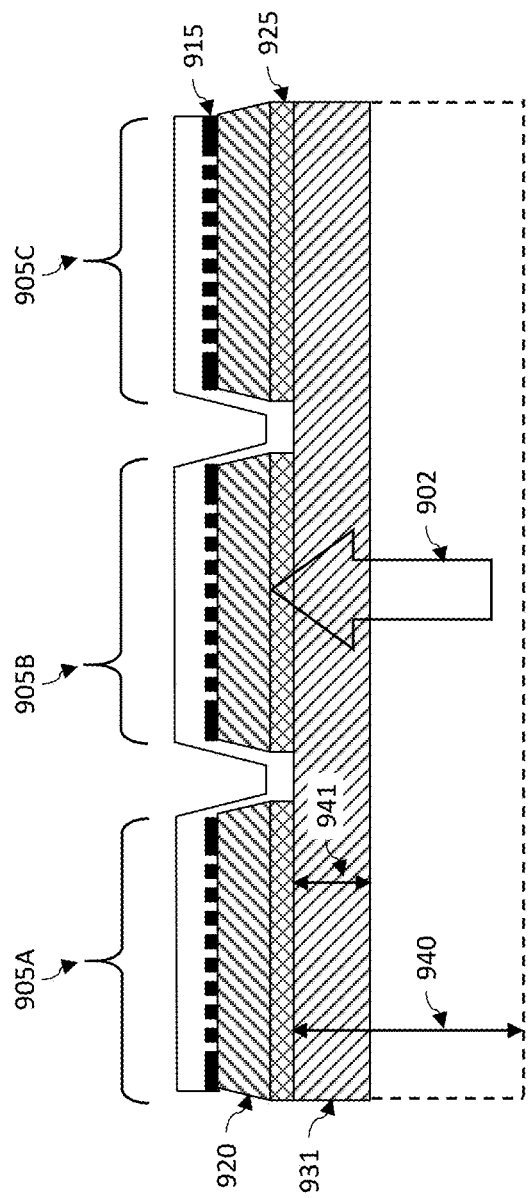
FIGS. 10A and 10B illustrate side, cross-sectional views of possible back-side illumination configurations of a THz detector array.

FIG. 10A illustrates a THZ detector array in a first possible back-side illumination configuration. In this configuration, the incident THz radiation 902 passes through the substrate 931 before reaching the heterojunction (i.e., the 2DEG). In order to reduce absorption of the THz radiation 902, the substrate 931 may be back-thinned (thinned) to reduce its thickness form a first thickness 940 to a second thickness 941. Substrate absorption may be further reduced through the use a low absorption material, such as silicon carbide (SiC) (e.g., instead of silicon (Si)).

Figure 10B:
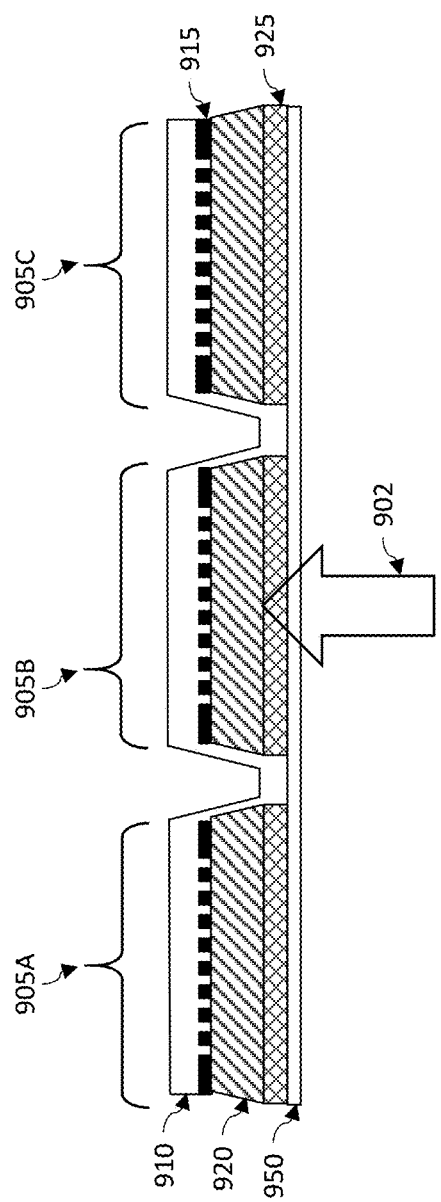

FIG. 10B illustrates a THZ detector array in a second possible back-side illumination configuration. In this configuration, the substrate is removed so that the incident THz radiation 902 experiences no substrate absorption. The process of removing the substrate may include applying a protection layer 910 to the front surface of the THz detector array to provide support and protection to the THz detector array during and after substrate removal. Additionally, after the substrate is removed an antireflection layer 950 may be added to the back surface of the THz detector array to further improve transmission (i.e., reduce reflection) of the THz radiation to the heterojunction (i.e., 2DEG).

While a GaN HEMT implementation has been disclosed the techniques disclosed may apply to HEMTs based on a variety of other materials including (but not limited to) indium phosphide (InP) and gallium arsenide (GaAs).

Figure 11:
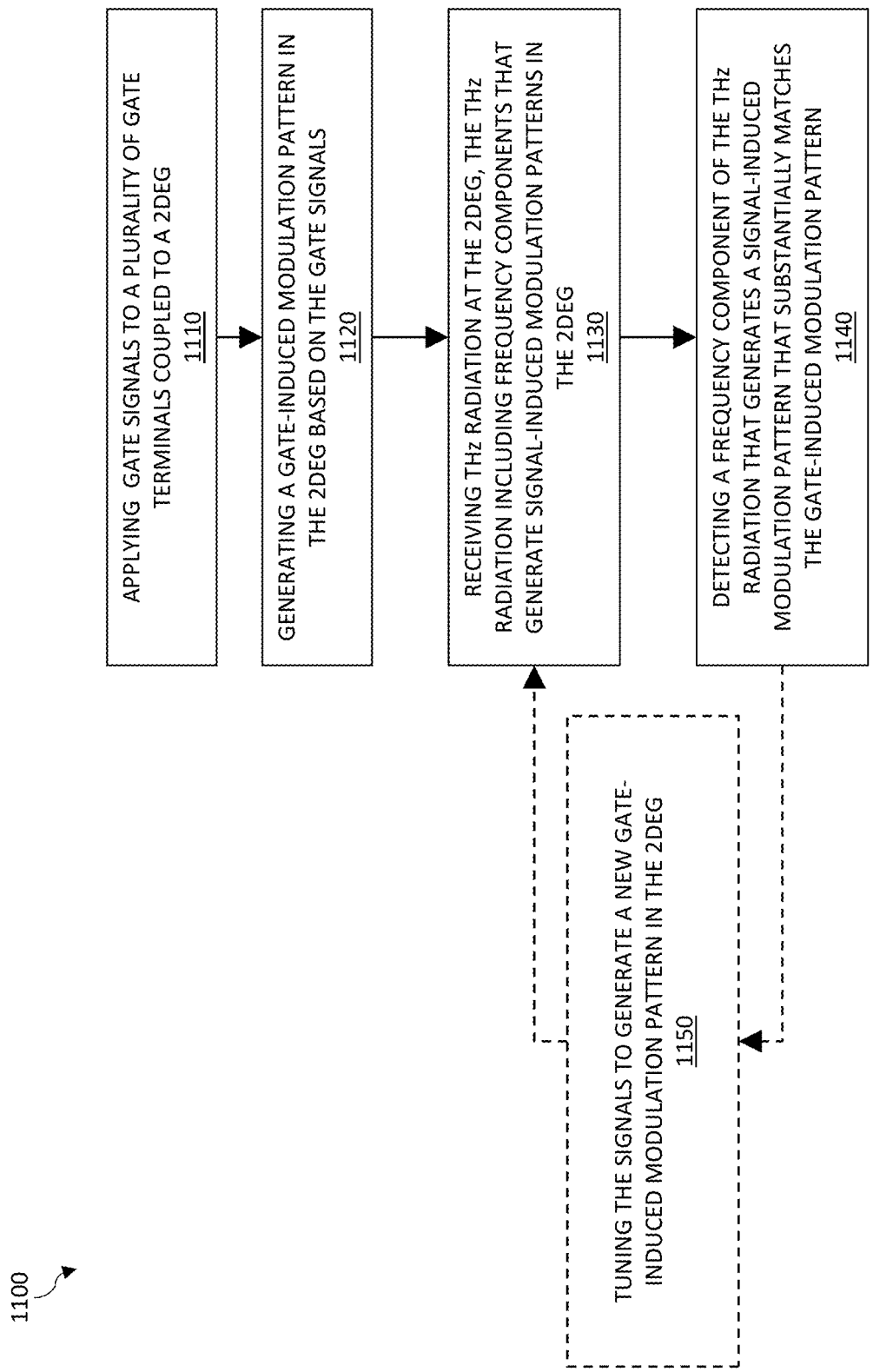
FIG. 11 illustrates a flow chart of a method for detecting THz radiation according to an implementation of the present disclosure.

FIG. 11 is a flowchart of a method for detecting THz radiation. The method 1100 includes supplying 1110 a first set of signals to a plurality of terminals coupled to a 2DEG. For example, the first set of signals may be gate signals to drive gate terminals of a multi-gate HEMT having a 2DEG formed by a heterojunction. The gate signals may collectively define a first tuning configuration. The gates terminals are (spatially) coupled to the 2DEG and the signals applied to the gates generate 1120 a gate-induced modulation pattern in the 2DEG that is based on the signals. The method further includes receiving 1130 THz radiation at the 2DEG. The THz radiation includes frequency components that generate signal induced modulation patterns in the 2DEG. For example, the signal-induced modulation pattern resulting from the THz radiation may be a superposition of signal-induced modulation patterns for each of the frequency components. The method further includes detecting 1140 a frequency component of the THz radiation that generates a signal-induced modulation pattern that corresponds to the gate-induced modulation pattern. In other words, the gate-induced modulation pattern can spatially filter which frequency component is electrically coupled for detection based on how well the signal-induced modulation pattern matches aspects (e.g., spatial frequency, spatial phase, and/or spatial amplitude) of the gate-induced modulation pattern. The signals applied to the plurality of terminals may be tuned 1150 (i.e., a second set of gate signals) to generate a new gate-induced modulation pattern in the 2DEG, and the frequency component of the received THz radiation that generates a signal induced modulation pattern that corresponds to (e.g., substantially matches) the new gate-induced modulation pattern may be detected.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. A terahertz detector circuit, comprising:
a high electron mobility transistor (HEMT) including:
a two-dimensional electron gas (2DEG) at a heterojunction between a first heterojunction layer and a second heterojunction layer; and
a plurality of gate terminals disposed on a trace layer, the first heterojunction layer between the trace layer and the 2DEG; and
a gate driver configured to apply signals to the plurality of gate terminals according to a tuning configuration in order to generate a gate-induced modulation pattern in the 2DEG, the gate-induced modulation pattern increasing a detection sensitivity for a particular terahertz signal.

2. The terahertz detector circuit according to claim 1, wherein the plurality of gate terminals are spaced apart and span at least a portion of the 2DEG.

3. The terahertz detector circuit according to claim 1, wherein the particular terahertz signal generates a signal-induced modulation pattern in the 2DEG that is correlated to the gate-induced modulation pattern.

4. The terahertz detector circuit according to claim 3, wherein a spatial frequency of the signal-induced modulation pattern is substantially equal to a spatial frequency of the gate-induced modulation pattern.

5. The terahertz detector circuit according to claim 4, wherein a spatial phase of the signal-induced modulation pattern is substantially equal to a spatial phase of the gate-induced modulation pattern.

6. The terahertz detector circuit according to claim 1, wherein the first heterojunction layer and the second heterojunction layer are materials having different bandgaps, the materials based on Gallium Nitride (GaN).

7. The terahertz detector circuit according to claim 1, wherein the first heterojunction layer and the second heterojunction layer are materials having different bandgaps, the materials based on Gallium Arsenide (GaAs).

8. The terahertz detector circuit according to claim 1, wherein the first heterojunction layer and the second heterojunction layer are materials having different bandgaps, the materials based on Indium Phosphide (InP).

9. The terahertz detector circuit according to claim 1, wherein the particular terahertz signal passes through the trace layer before reaching the heterojunction according to a front-side illumination configuration.

10. The terahertz detector circuit according to claim 1, wherein the particular terahertz signal passes through a substrate layer before reaching the heterojunction according to a back-side illumination configuration.

11. The terahertz detector circuit according to claim 10, wherein the substrate layer of the HEMT is silicon carbide (SiC).

12. The terahertz detector circuit according to claim 1, wherein the HEMT is coupled to an antenna tuned to receive the particular terahertz signal.

13. The terahertz detector circuit according to claim 1, wherein the tuning configuration approximates a sinusoid.

14. The terahertz detector circuit according to claim 13, wherein the signals applied to the plurality of gate terminals are each at one of a plurality of levels.

15. The terahertz detector circuit according to claim 14, wherein the plurality of levels are an ON level that when applied to a gate increases a local electron density under the gate and an OFF level that when applied to the gate decrease the local electron density under the gate.

16. A terahertz detector array, comprising:
a plurality of high electron mobility transistors (HEMTs), each HEMT including:
a two-dimensional electron gas (2DEG) at a heterojunction between a first heterojunction layer and a second heterojunction layer; and
a plurality of gate terminals disposed on a trace layer, the first heterojunction layer between the trace layer and the 2DEG;
a gate driver circuit configured to apply signals to the plurality of gate terminals of each HEMT according to a tuning configuration in order to generate a gate-induced modulation pattern in the 2DEG, the gate-induced modulation pattern increasing a detection sensitivity for a particular terahertz signal; and
a sensing and readout circuit configured to receive detection signals from each HEMT in response to the particular terahertz signal and to generate an output based on the detection signals.

17. The terahertz detector array according to claim 16, wherein the output is a terahertz image.

18. The terahertz detector array according to claim 16, wherein the output is a multi-spectral terahertz image.

19. A method for detecting terahertz (THz) radiation, the method comprising:
applying a first set of gate signals to a plurality of gate terminals that are spatially coupled to a two-dimensional electron gas (2DEG);
generating a first gate-induced modulation pattern in the 2DEG based on the first set of gate signals;
receiving THz radiation at the 2DEG, the THz radiation including frequency components that generate signal-induced modulation patterns in the 2DEG; and
detecting a first frequency component of the THz radiation that generates a first signal-induced modulation pattern that substantially matches the first gate-induced modulation pattern.

20. The method for detecting terahertz (THz) radiation according to claim 19, further including:
applying a second set of gate signals to the plurality of gate terminals;
generating a second gate-induced modulation pattern in the 2DEG based on the second set of gate signals; and
detecting a second frequency component of the THz radiation that generates a second signal-induced modulation pattern that substantially matches the second gate-induced modulation pattern.

* * * * *